United States Patent
Chen et al.

(10) Patent No.: US 7,177,977 B2
(45) Date of Patent: Feb. 13, 2007

(54) OPERATING NON-VOLATILE MEMORY WITHOUT READ DISTURB LIMITATIONS

(75) Inventors: Jian Chen, San Jose, CA (US); Lee Merrill Gavens, Saratoga, CA (US)

(73) Assignee: Sandisk Corporation, Milpitas, CA (US)

( * ) Notice: Subject to any disclaimer, the term of this patent is extended or adjusted under 35 U.S.C. 154(b) by 525 days.

(21) Appl. No.: 10/805,079

(22) Filed: Mar. 19, 2004

(65) Prior Publication Data

US 2005/0210184 A1    Sep. 22, 2005

(51) Int. Cl.
    *G06F 12/00* (2006.01)
(52) U.S. Cl. .................. 711/103; 711/154; 711/163; 365/185.17; 365/185.33
(58) Field of Classification Search ............... 711/103, 711/154, 163; 365/185.17, 185.33
    See application file for complete search history.

(56) References Cited

U.S. PATENT DOCUMENTS

| | | | |
|---|---|---|---|
| 5,101,378 A | | 3/1992 | Radjy et al. |
| 5,449,947 A | | 9/1995 | Chen et al. |
| 5,570,315 A | * | 10/1996 | Tanaka et al. ......... 365/185.22 |
| 5,581,504 A | | 12/1996 | Chang |
| 5,774,397 A | * | 6/1998 | Endoh et al. .......... 365/185.19 |
| 5,812,457 A | * | 9/1998 | Arase .................... 365/185.22 |
| 5,814,853 A | * | 9/1998 | Chen .......................... 257/315 |
| 5,898,615 A | | 4/1999 | Chida |
| 5,917,766 A | | 6/1999 | Tsuji et al. |
| 5,943,257 A | * | 8/1999 | Jeon et al. .................. 365/145 |
| 6,046,935 A | * | 4/2000 | Takeuchi et al. ....... 365/185.03 |
| 6,061,280 A | | 5/2000 | Aritome |
| 6,154,391 A | | 11/2000 | Takeuchi et al. |
| 6,175,522 B1 | | 1/2001 | Fang |
| 6,222,762 B1 | * | 4/2001 | Guterman et al. ..... 365/185.03 |
| 6,240,016 B1 | | 5/2001 | Haddad et al. |
| 6,380,033 B1 | | 4/2002 | He et al. |
| 6,456,528 B1 | | 9/2002 | Chen |
| 6,522,580 B2 | * | 2/2003 | Chen et al. ............ 365/185.02 |
| 6,570,785 B1 | | 5/2003 | Mangan et al. |
| 6,707,714 B2 | | 3/2004 | Kawamura |
| 6,891,262 B2 | * | 5/2005 | Nomoto et al. ............. 257/692 |
| 2003/0025147 A1 | * | 2/2003 | Nomoto et al. ............. 257/314 |
| 2003/0053334 A1 | | 3/2003 | Chen |

FOREIGN PATENT DOCUMENTS

EP    1172822    1/2002

* cited by examiner

*Primary Examiner*—Stephen C. Elmore
(74) *Attorney, Agent, or Firm*—Vierra Magen Marcus & DeNiro LLP

(57) ABSTRACT

When reading a memory cell on a NAND string, the word lines for the memory cells not being read will receive a voltage so that those memory cells operate as pass gates. Over time, if there are a lot of read operations without any program operations, the cells not being read may suffer from Read Disturb because the voltage applied to the word lines may cause electrons to accumulate in the floating gates of the non-selected cells. The accumulation of charge in the floating gates raises the threshold voltage. To avoid the limitations of Read Disturb, only one word line of a block (or other grouping) is used to program and read data. In a system using NAND flash memory, the word line being read is not typically subjected to read disturb. Thus, a NAND flash memory that restricts programming and reading to one word line of a block is not likely to exhibit read disturb in that block.

41 Claims, 9 Drawing Sheets

OPERATING NON-VOLATILE MEMORY WITHOUT READ DISTURB LIMITATIONS

BACKGROUND OF THE INVENTION

1. Field of the Invention

The present invention relates generally to technology for memory devices and, more specifically, to operating memory devices without the limitations of read disturb.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices, desktop computers and other devices. Electrical Erasable Programmable Read Only Memory (EEPROM) and flash memory are among the most popular non-volatile semiconductor memories.

Typical EEPROMs and flash memories utilize a memory cell with a floating gate that is provided above and insulated from a channel region in a semiconductor substrate. The floating gate is positioned above and between source and drain regions. A control gate is provided over the floating gate. The threshold voltage of the memory is controlled by the amount of charge that is retained on the floating gate. That is, the minimum amount of voltage that must be applied to the control gate before the memory cell is turned on to permit conduction between its source and drain is controlled by the level of charge on the floating gate.

Some EEPROM and flash memory devices have a floating gate that is used to store two ranges of charges and, therefore, the memory cell can be programmed/erased between two states (binary memory cells). When programming an EEPROM or flash memory device, a program voltage is applied to the control gate and the bit line is grounded. Electrons are injected into the floating gate. When electrons accumulate in the floating gate, the floating gate becomes negatively charged and the threshold voltage of the memory cell is raised.

Typically, the program voltage applied to the control gate is applied as a series of pulses. The magnitude of the pulses is increased with each pulse by a predetermined step size. In the periods between the pulses, verify operations are carried out. That is the programming level of each cell being programmed in parallel is read between each programming pulse to determine whether it is equal to or greater than a verify level to which it is being programmed. One means of verifying the programming is to test conduction at a specific compare point.

Conduction represents an "on" state of the device corresponding to the flow of current across the channel of the device. An "off" state corresponds to no current flowing across the channel between the source and drain. Typically, a flash memory cell will conduct if the voltage being applied to the control gate is greater than the threshold voltage and the memory cell will not conduct if the voltage applied to the control gate is less than the threshold voltage. By setting the threshold voltage of the cell to an appropriate value, the cell can be made to either conduct or not conduct current for a given set of applied voltages. Thus, by determining whether a cell conducts current at a given set of applied voltages, the state of the cell can be determined.

Memory cells are erased by raising the p-well to an erase voltage (e.g. 20 volts) and grounding the word lines of a selected block (or other unit) of memory cells. The source and bit lines are floating. Erasing can be performed on the entire memory array, separate blocks, or another unit of cells. Electrons are transferred from the floating gate to the p-well region and the threshold voltage becomes negative.

One example of a flash memory system uses the NAND structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0.

FIG. 3 provides a cross-sectional view of the NAND string described above. As depicted in FIG. 3, the transistors (also called cells or memory cells) of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an oxide layer separating the control gate and floating gate. Note that FIG. 3 appears to depict a control gate and floating gate for transistors 120 and 122. However, for transistors 120 and 122, the control gate and the floating gate are connected together. The control gates of the memory cells (100, 102, 104, 106) form the word lines. N+ diffused layers 130, 132, 134, 136 and 138 are shared between neighboring cells whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 1–3 shows four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 4 shows three NAND strings 202, 204 and 206 of a memory array having many more NAND strings. Each of the NAND strings of FIG. 4 includes two select transistors and four memory cells. For example, NAND string 202 includes select transistors 220 and 230, and memory cells 220, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array of memory cells.

Each memory cell can store data (analog or digital). When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage is positive after a program operation and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored.

A memory cell can also store multiple levels (more than one programmed level/state) of information, for example, multiple bits of digital data. In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00." The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-level flash memory cells. To achieve proper data storage for a multi-level cell, the multiple ranges of threshold voltage levels should be separated from each other by sufficient margin so that the level of the memory cell can be read, programmed or erased in an unambiguous manner.

Relevant examples of NAND type flash memories and their operation are provided in the following U.S. Patents/Patent Applications, all of which are incorporated herein by reference in their entirety: U.S. Pat. No. 5,570,315; U.S. Pat. No. 5,774,397, U.S. Pat. No. 6,046,935, U.S. Pat. No. 6,456,528 and U.S. patent application. Ser. No. 09/893,277 (Publication No. US2003/0002348), now U.S. Pat. No. 6,522,580.

In the read and verify operations, the select gates (SGD and SGS) and the unselected word lines are raised to a read pass voltage (e.g. 5 volts) to make the transistors operate as pass gates. The selected word line is connected to a voltage, a level of which is specified for each read and verify operation in order to determine whether a threshold voltage of the concerned memory cell has reached such level. For example, in a read operation for memory cell 224, assuming a two level memory, the selected word line WL2 may be grounded so that it is detected whether the threshold voltage is higher than 0V and the unselected word lines WL0, WL1 and WL3 are at 5 volts. In a verify operation, the selected word line WL2 is connected to 2.4V, for example, so that it is verified whether the threshold voltage has reached at least 2.4V. The source and p-well are at zero volts. The selected bit lines are pre-charged to a level of, for example, 0.7V. If the threshold voltage is higher than the verify level of 2.4V, the potential level of the concerned bit line maintains the high level because of the non-conductive memory cell. On the other hand, if the threshold voltage is lower than the read or verify level, the potential level of the concerned bit line decreases to a low level, for example less than 0.5V, because of the conductive memory cell. The state of the memory cell is detected by a sense amplifier that is connected to the bit line.

Because the unselected word lines receive a pass voltage (e.g. 5 volts), memory cells along unselected word lines during a read operation will receive a voltage on their control gate which over time may cause electrons to be injected into their floating gate, thereby, raising the threshold voltage of those memory cells. Experience has shown that if the memory cells experienced many read operations, without a program or erase operation, the threshold voltage will increase over time. This behavior is called Read Disturb. In the above example of reading memory cell 224, memory cells 222, 226, and 228 may experience Read Disturb.

There are some applications that may need to be able to perform many read operations without performing an intervening program or erase operation. For example, there are computing devices that use flash memory to store BIOS code. In some cases, the BIOS code is programmed once and then read many times at power-up and/or reset. Thus, the BIOS code may be subject to Read Disturb.

Additionally, some handheld computing devices and mobile telephones use flash memory to store operating system code. This code is typically written once and read many times. It is common for these devices to read the operating system code each time the device turns on. In some cases, the device (the entire device, the processor, or the memory system) may turn off after a predetermined amount of inactivity in order to minimize battery usage. When the device is used again, the relevant components power back on and the operating system code is read. Thus, it is possible that for a frequently used device (e.g. used for a business), the operating system code is read many times a day. If the device is used long enough, the memory storing the operating system code may be subject to errors due to Read Disturb, causing the operating system code to be corrupted.

Some previously implemented attempts to avoid Read Disturb includes using ECC to correct errors, periodically refresh the data by performing a programming operation or periodically re-writing the data to another location. These solutions, however, may require extra hardware or may negatively impact performance.

SUMMARY OF THE INVENTION

The present invention, roughly described, pertains to technology for operating memory devices without the limitations of Read Disturb. To avoid the limitations of Read Disturb, only one word line of a block (or other grouping) is used to store data. The system is prohibited from using the other word lines of the block.

One embodiment of the present invention includes performing read operations to non-volatile storage elements associated with a first word line of a block (or other grouping) of non-volatile storage elements and prohibiting read operations to non-volatile storage elements associated with other word lines of the block (or other grouping) of non-volatile storage elements. In some embodiments, the system will perform one or more program operations to non-volatile storage elements associated with the first word line of the block and prohibit program operations to non-volatile storage elements associated with other word lines of the block. In some implementations, the non-volatile storage elements are NAND flash memory cells arranged on a set of NAND strings, the first word line connects to each of the NAND strings and the other word lines connect to each of the NAND strings. In one embodiment, the non-volatile storage elements are multi-level NAND flash memory cells, the first word line is associated with a first logical page and a second logical page and the other word lines are associated with other logical pages.

One embodiment of a memory system implementing the present invention includes an array of non-volatile storage elements grouped into blocks, each block being controlled by a set of word lines, and a control system. The control system performs read operations for a first word line of a first block of the non-volatile storage elements and will not perform read operations for other word lines of the first block of non-volatile storage elements. In one example, a control system can include a controller, a state machine, decoders, drivers, sense amplifiers, other logic, subsets of the above and/or combinations of the above.

One implementation of the present invention includes processor readable code stored on one or more processor readable storage devices (e.g. flash memory, RAM, ROM, optical disk, hard disk, floppy disk, etc.). The code programs one or more processing devices to allow read operations using one word line of a block of non-volatile storage elements and not allow read operations to other word lines of the block of non-volatile storage elements.

These and other objects and advantages of the present invention will appear more clearly from the following description in which the preferred embodiment of the invention has been set forth in conjunction with the drawings.

DETAILED DESCRIPTION

To avoid the limitations of Read Disturb, one embodiment of the present invention proposes that, for a block (or other grouping) or non-volatile storage elements, data is stored on those non-volatile storage elements associated with one word line of the block (or other grouping). The system is prohibited from storing data on those non-volatile storage elements associated with the other word lines of that block.

Figure 5:
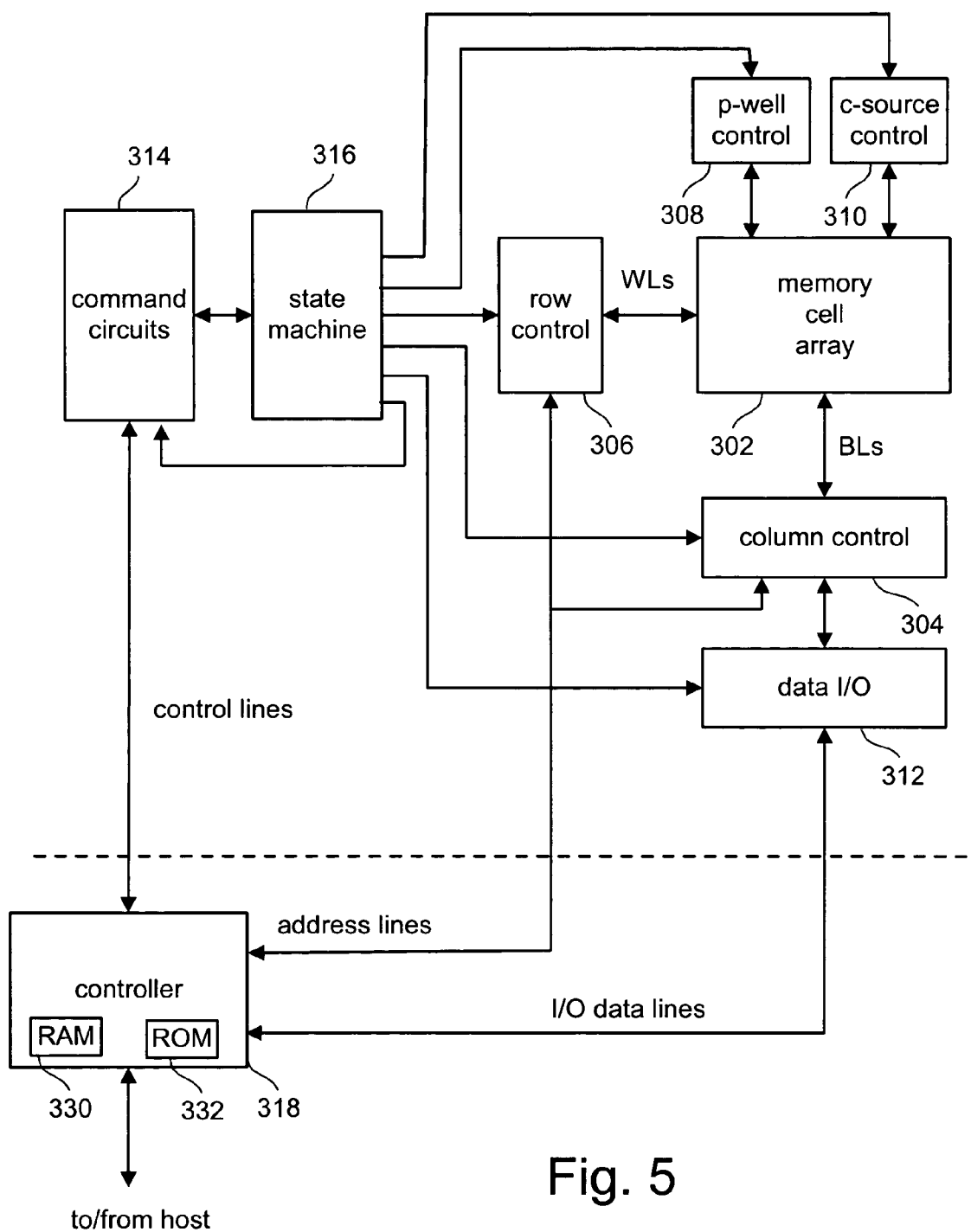
FIG. 5 is a block diagram of one embodiment of a non-volatile memory system in which the various aspects of the present invention are implemented.

FIG. 5 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply program voltages and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred (via command circuits 314) to state machine 316, which controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, personal digital assistant, etc. Controller 318 communicates with the host in order to receive commands from the host, receive data from the host, provide data to the host and provide status information to the host. Controller 318 converts commands from the host into command signals that can be interpreted and executed by command circuits 314, which is in communication with state machine 316. Controller 318 typically contains buffer memory for the user data being written to or read from the memory array.

One exemplar memory system comprises one integrated circuit that includes controller 318, and one or more integrated circuit chips that each contain a memory array and control circuits (e.g., 304, 306, 308, 310, 312, 314 and/or 316). In one embodiment, the memory arrays and controller circuit are together on one integrated circuit chip. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller being embedded in the host). Thus, the controller can be embedded in the host or included within a removable memory system.

Figure 6:
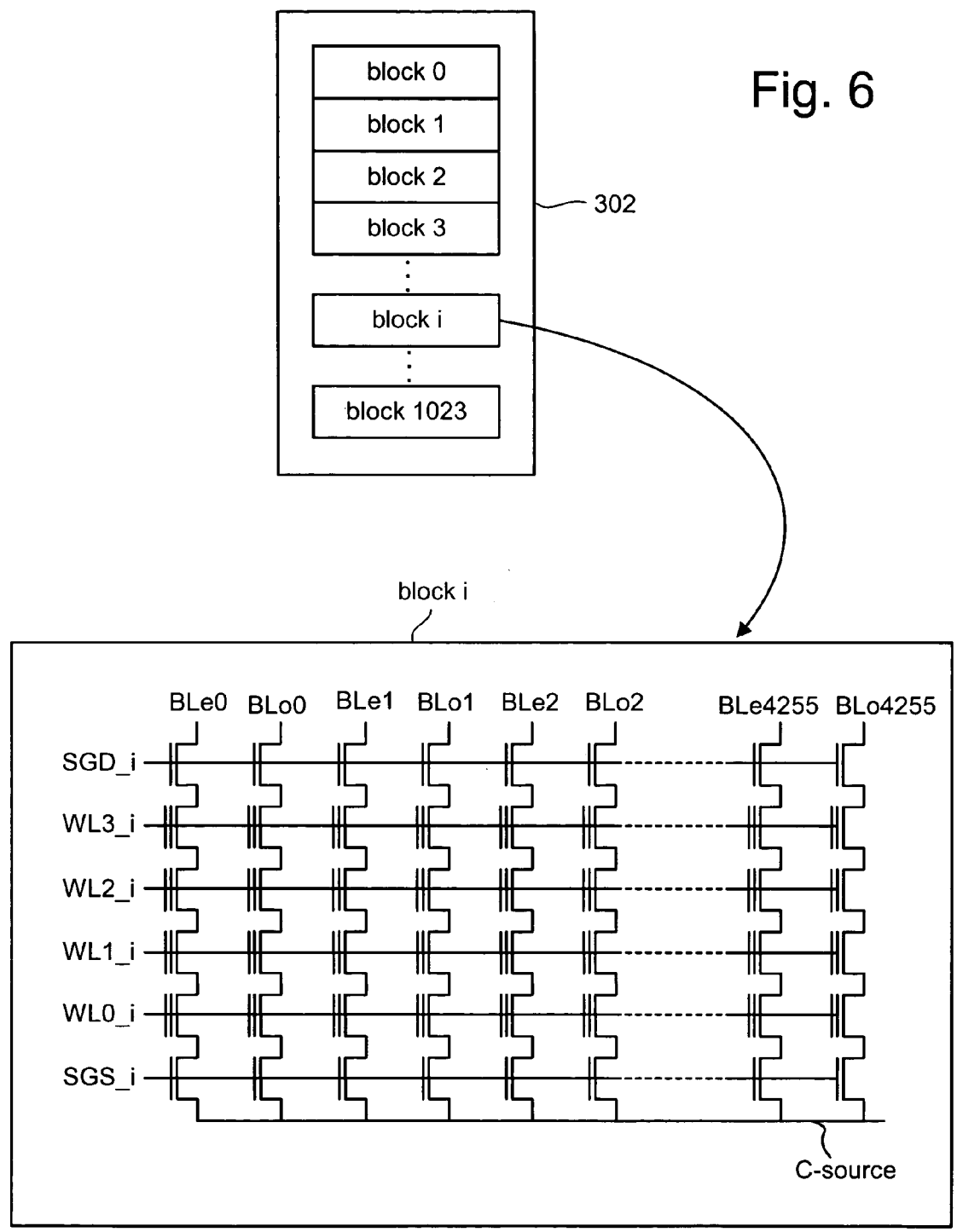
FIG. 6 illustrates an example of an organization of a memory array.

With reference to FIG. 6, an example structure of memory cell array 302 is described. As one example, a NAND flash EEPROM is described that is partitioned into 1,024 blocks. In one embodiment, the data stored in each block is simultaneously erased. In other embodiments, the unit of erase is different than a block. For example, a block can refer to a minimum unit of cells for performing a read operation, a minimum unit of cells for performing a programming operation, a grouping of physically continuous/neighboring memory cells, or another grouping of cells that has some reason for the grouping.

In each block in the example of FIG. 6, there are 8,512 columns that are divided into even columns and odd columns. The bit lines are also divided into even bit lines (BLe) and odd bit lines (BLo). FIG. 6 shows four memory cells connected in series to form a NAND string. Although four cells are shown to be included in each NAND string, more or less than four can be used. One terminal of the NAND string is connected to corresponding bit line via a first select transistor SGD, and another terminal is connected to c-source via a second select transistor SGS.

During read and programming operations, 4,256 memory cells are simultaneously selected. The memory cells selected have the same word line and the same kind of bit line (e.g. even bit lines). Therefore, 532 bytes of data can be read or programmed simultaneously. These 532 bytes of data that are simultaneously read or programmed form a logical page. Therefore, one block of memory 302 can store at least eight logical pages. In one embodiment of the binary mode, each word line is associated with two logical pages: one logical page for even bit lines and one logical page for odd bit lines. In other embodiments, a word line can be associated with one or more logical pages. When each memory cell stores two bits of data (e.g. a multi-level cell), one block stores 16 pages and each of the word lines is associated with four logical pages: two logical pages for even bit lines and two logical pages for odd bit lines. Other sized blocks can also be used with the present invention.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation for a two level memory cell, the selected word line WL2 may be grounded, so that it is detected whether the threshold voltage is higher than 0V. The source and p-well are at zero volts. The selected bit lines (BLe) are pre-charged to a level of, for example, 0.7V. If the threshold voltage is higher than the read or verify level, the potential level of the concerned bit line (BLe) maintains the high level because of the non-conductive memory cell. On the other hand, if the threshold voltage is lower than the read or verify level, the potential level of the concerned bit line (BLe) decreases to a low level, for example less than 0.5V, because of the conductive memory cell (M). The state of the memory cell is detected by a sense amplifier that is connected to the bit line.

Figure 7:
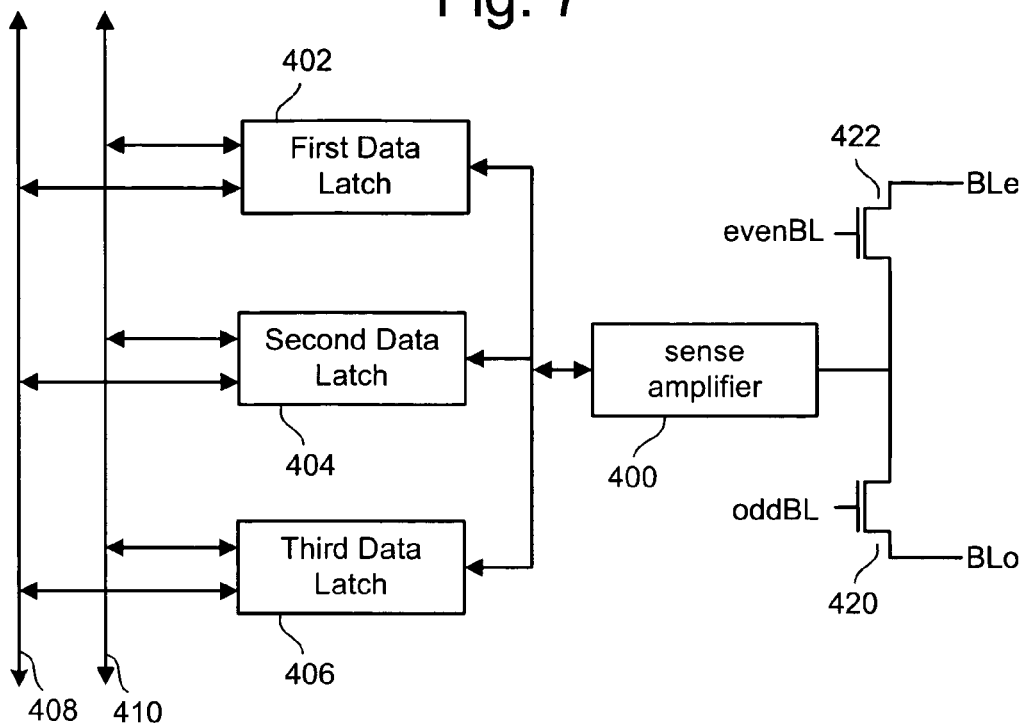
FIG. 7 depicts a portion of the column control circuit.

FIG. 7 depicts a portion of column control circuit 304 of FIG. 5. Each pair of bit lines (e.g. BLe and BLo) is coupled to a sense amplifier 400. The sense amplifier is connected to three data latches: first data latch 402, second data latch 404 and third data latch 406. Each of the three data latches is capable of storing one bit of data. The sense amplifier senses the potential level of the selected bit line during read or verify operations, stores the sensed data in a binary manner, and controls the bit line voltage during the program operation. The sense amplifier is selectively connected to the selected bit line by selecting one of signals of "evenBL" and "oddBL." Data latches 402, 404 and 406 are coupled to I/O lines 408 to output read data and to store program data. I/O lines 408 are connected to data input/output buffer 312 of FIG. 5. Data latches 402, 404 and 406 are also coupled to status line(s) 410 to receive and send status information. In one embodiment, there is a sense amplifier, first data latch 402, second data latch 404 and third data latch 406 for each pair (even and odd) of bit lines.

Figure 8:
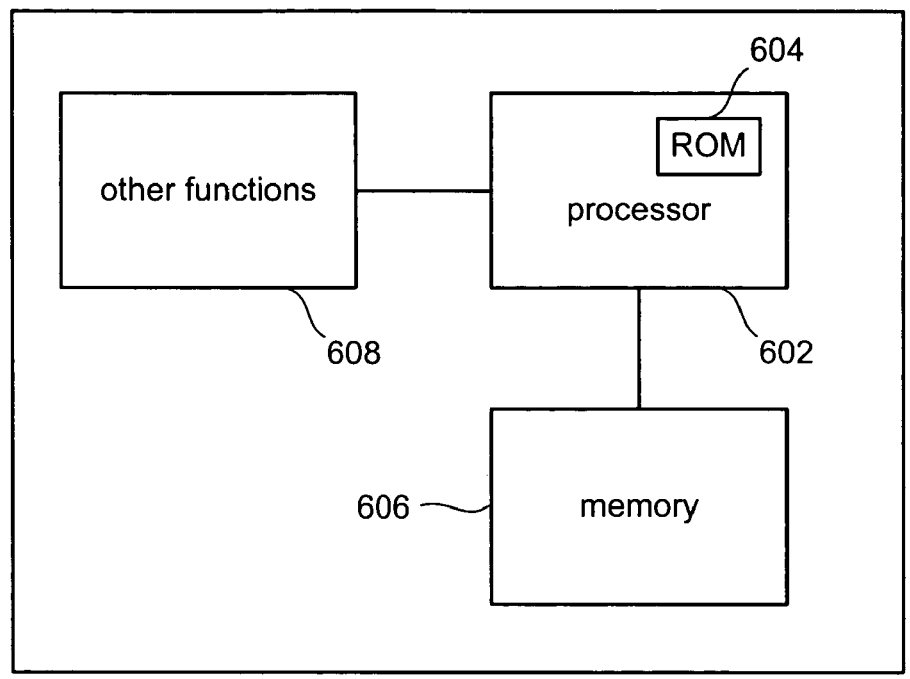
FIG. 8 depicts a block diagram of an example of electrical device that uses a memory according to one embodiment of the present invention.

FIG. 8 is a block diagram of one example of a system that includes the memory system of the present invention. The depicted system could be a computer, camera, telephone, Personal Digital Assistant (PDA), or other computing device. The system includes a processor 602 (which can include one or more processors) with ROM 604. In one embodiment, ROM 604 stores code for programming processor 602. Processor 602 is in communication with memory 606 which may store data, operating system code, application code, etc. In one embodiment, ROM 604 stores code for programming processor 602 to read from and write data to memory 606. In one embodiment, memory 606 is non-volatile memory, such as the system of FIG. 5 (with processor 602 using the code of ROM 604 to operate as the Controller). The system also includes other functions 608 which is circuitry for performing the other functions of the camera, computer, PDA, telephone, other computing device etc. In one example, the code and data stored in memory 606 is used to program processor 602 to work with other function circuitry 608 in order to operate as a camera, computer, PDA, telephone, other computing device etc.

Figure 9:
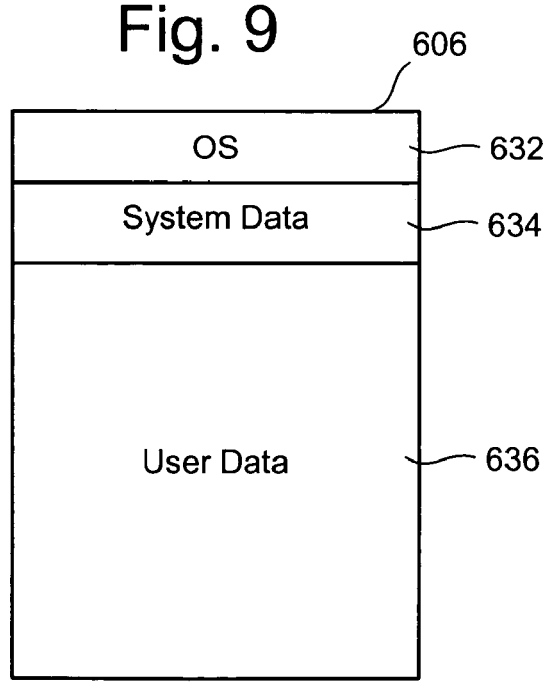
FIG. 9 is a block diagram of an example of a memory used in the electrical device of FIG. 8.

FIG. 9 depicts the contents of the memory 606, which in one embodiment includes operating system 632, system data 634 and user data 636. During operating of the system of FIG. 8, it is contemplated that system data 634 and user data 636 may be both written to and read from many times. However, in some instances, operating system 632 may be programmed once and then read many times without another program operation. Therefore, there is a potential that operating system 632 may be subject to Read Disturb. To avoid the limitations of Read Disturb, the present invention proposes to use only one word line of the blocks (or other grouping) that stores operating system 632 in order to perform program and read operations. The system is prohibited from using the other word lines of those blocks.

For example, looking back at FIG. 6, the system will choose one word line of a block. For example purposes, assume that word line WL1 is chosen. Thus, no data will be programmed or read for memory cells connected to WL0, WL2 and WL3 (memory cells whose control gate is connected to WL0, WL2 or WL3). Data will be programmed to and read from memory cells connected to word line WL1. All read operations to the block will be applying 0 volts to WL1 (for binary memory cells); therefore, cells connected to WL1 will not experience Read Disturb. The other word lines WL0, WL2 and WL3 will receive 5 volts (in binary mode) during a read operation. While cells connected to WL0 and WL2 (the two word lines that neighbor WL1) may experience some Read Disturb, these cells do not store data so there will not be a problem. In order to prevent Read Disturb to the memory cells of WL1, the memory cells of WL0 and WL2 (the word lines that neighbor WL1) should not be read.

Thus, for binary memory cells, of the eight logical pages in the block, only the two logical pages associated with word line WL1 are used. The remaining logical pages in the block are not used to store data. On one hand, memory space is going unused. On the other hand, the memory space that is used is protected from Read Disturb.

Processor 602 is programmed to perform the invention described herein by code stored in ROM 604 (or another type of storage device). In one embodiment, the code stored in ROM 604 programs processor 602 to perform the processes depicted in FIGS. 10, 10A and/or 10B. In step 702 of FIG. 10, blocks to be protected by the present invention are identified. There are many ways to perform step 702. For example, the system may determine how many blocks in memory 606 are needed to store the operating system and reserve a set of blocks accordingly. In other embodiment, code or data other than the operating system can be protected. In some embodiments, ROM 604 can be pre-coded with a set of blocks to be protected. In other alternatives, the system can query a user or host system to specify the number or identity of protected blocks or protected logical pages.

In step 704, the one word line allowed to be used in each protected block is identified. In one embodiment, the identity of the word line to be used is pre-coded in ROM 604. In other embodiments, the system can query a user or host system. The code of ROM 604 allows data to be programmed into memory cells in the protected blocks that are connected to the one word line previously identified (step 706). The code of ROM 604 prohibits programming of any of the memory cells connected to other word lines for the protected blocks (step 708). Similarly, code of ROM 604 allows data to be read from memory cells in the protected blocks that are connected to the one word line previously identified (step 710). The code of ROM 604 prohibits reading of any of the memory cells connected to other word lines for the protected blocks (step 712). When reading and programming blocks that are not protected, the above steps of allowing and prohibiting do not apply; therefore, data is programmed and read in the usual manner. Note that steps 706–712 can be performed in different orders and/or concurrently. While the above discussion describes software for programming a processor, specialized hardware can be used with or without software.

There are many ways to allow and prohibit programming. In one embodiment, a list of allowed and prohibited word lines, blocks, addresses and/or logical pages can be maintained in registers, memory 606 or elsewhere. In another embodiment, the word lines that are to be used for programming and reading are identified in advance and the word lines that are to be prohibited are disconnected from high voltage sources to prevent programming memory cells connected to those lines.

In one embodiment, the flash memory is organized at the physical level into chips, blocks and sectors that are referred to as a physical block address (PBA). One or more sectors are in a page, and one or more pages are in a block. Note that in some implementations, a sector corresponds to a logical page. In some embodiments, a logical page may correspond to multiple (e.g., 4) sectors.

Figure 10:
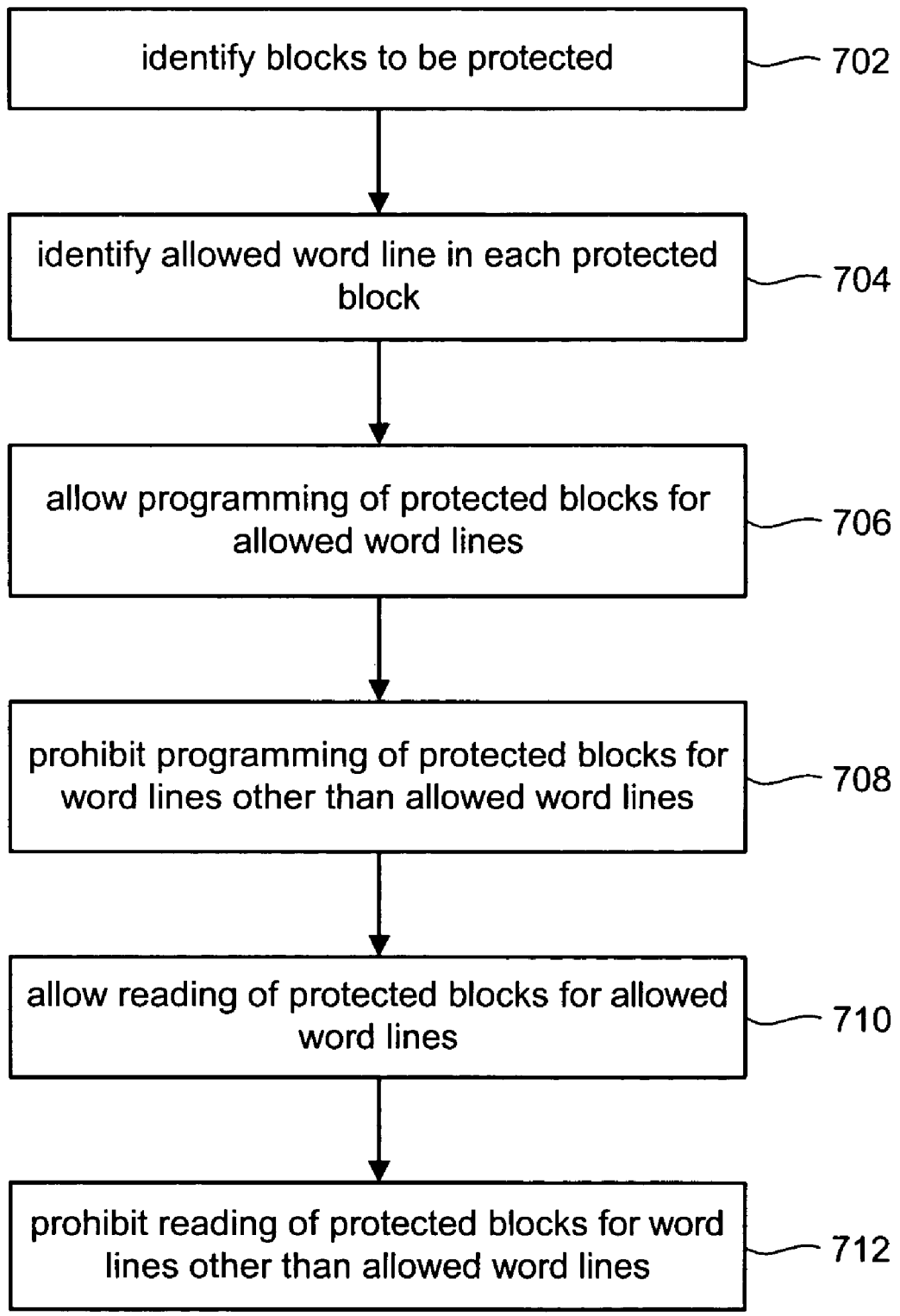
FIG. 10 is a flow chart describing one embodiment of a process for operating memory devices without the limitations of Read Disturb.
Figure 10A:
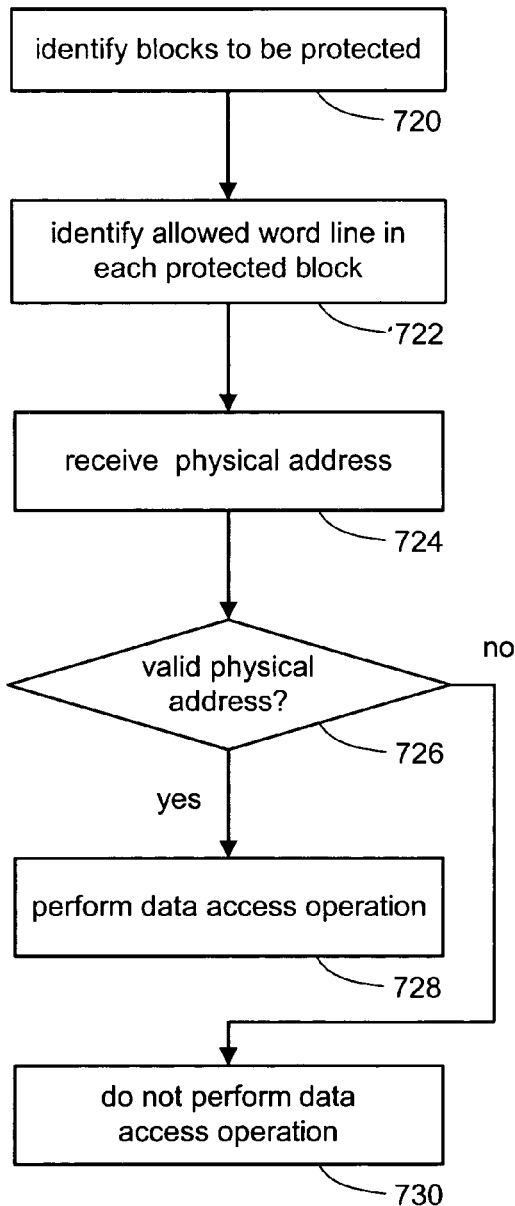
FIG. 10A is a flow chart describing an implementation of a process for operating memory devices without the limitations of Read Disturb.

FIG. 10A is a flow chart describing an implementation of the process of FIG. 10 that pertains to an application operating at the physical block level that reads, programs and/or erases a flash memory. In step 720, the blocks to be protected are identified. In step 722, the one word line allowed to be used in each protected block is identified. In step 724, a PBA is received by a function and that function then tests (in step 726) whether the PBA is a valid PBA to access. For example, when an application operating at the physical block level wants to read, program or erase the flash memory, the application first calls the following function:

BOOLEAN PBA_Valid(PBA, NumberSectors)

where

PBA is the physical chip, block and sector where the memory access would start; and NumberSectors is the number of consecutive sectors within that block to access.

PBA_Valid( ) compares PBA and NumberSectors with a list of chips, blocks and word lines that have been identified to be protected. If the chip and block are not on this list, then the block is not being protected and the function returns TRUE. If the chip and block are on the list to be protected, the routine will return TRUE only if the sector and NumberSectors fit within the identified allowed word line that is being used on that block. The routine PBA_Valid( ) needs to look at both the starting physical block address and the number of sectors being accessed. The starting address might be valid, but the range of sectors being accessed might extend on to a reserved word line. Based on the value returned by PBA_Valid( ), the calling application will know whether or not it is permitted to proceed with the data access.

The list of chips and blocks to be protected can be set during the design process or dynamically managed by the software. When a block is dynamically identified to be protected, the block is erased and added to the designated list. Once on the list, only one word line will be accessible on that block. When a block is unassigned from the list of chips and blocks to be protected, the block is erased and removed from the list. The block then becomes available for normal access to all of its sectors.

Several options exist for maintaining the list of chips and blocks to be protected. If the list is set during the design phase, the list may be explicitly written into the software. As an alternative the list may be written in the flash memory and read at an appropriate time. As another alternative, a flag can be added to the block header information that indicates that the block has been identified to be protected. A list of the identified blocks can be assembled by scanning the block headers or the list can be eliminated altogether by having PBA_Valid( ) read the block header during the validation process. The block header information must be written on the same word line that contains the data in order to avoid creating a read disturb when the header is read.

If the PBA is valid (step 726), then the data access operation (e.g., program, read or erase) is performed (step 728). If the PBA is not valid, then the data access operation is not performed (step 730).

Many operating system level applications access flash memory using logical block addresses (LBA). With logical block addressing, the application sees a continuous range of sectors that are numbered 0 through the capacity of the flash memory.

In an embodiment using LBAs, the LBAs are mapped to physical sectors. When an application seeks to access the memory, the LBA (or LBAs) provided by the application is/are converted to a physical address(es) using the mapping of LBAs to physical addresses. For blocks that are not identified as being protected, LBAs can be mapped to each sector in the block. For blocks identified as being protected, only the sectors associated with the one identified allowed word line are mapped to LBAs. The sectors on the other word lines in protected blocks have no LBAs mapped to them. Because there are no LBAs that correspond to the physical sectors on the unused word lines, there is no opportunity for an application to access those sectors and cause a read disturb on the identified word lines of the protected blocks. The physical blocks that hold the designated logical sectors can be set either statically or dynamically.

Figure 11:
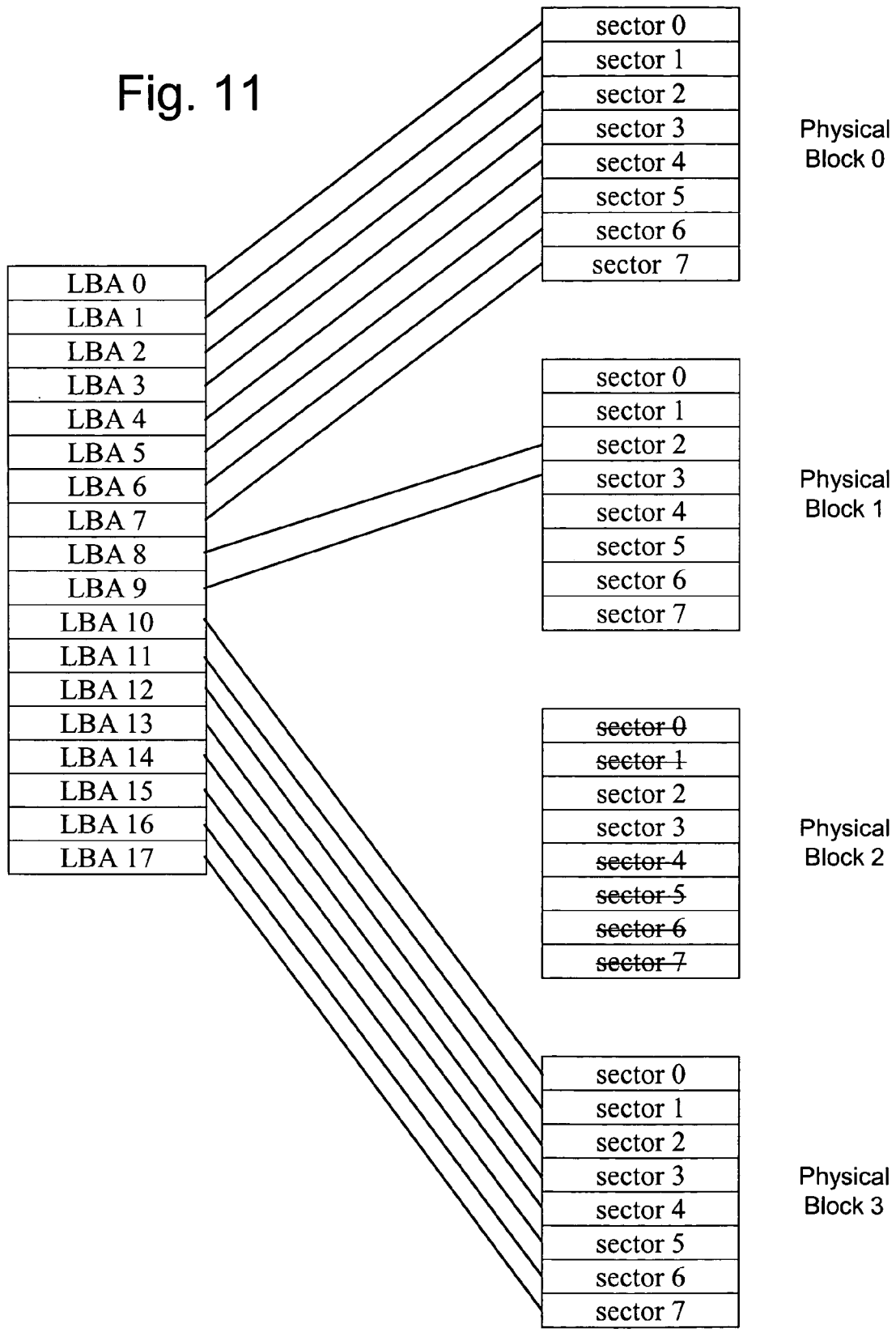
FIG. 11 depicts an example of logical to physical mapping.

FIG. 11 depicts an example of the logical to physical mapping. FIG. 11 shows a portion of a data structure for mapping eighteen LBAs (LBA0–LBA17) to Physical Block 0, Physical Block 1, and Physical Block 3. For example, the physical blocks each have eight sectors, with one sector corresponding to a page and one word line corresponding to two sectors. Assume that Physical Block 0 and Physical Block 3 are not identified as being protected; therefore, each of the sectors of Physical Block 0 and Physical Block 3 are mapped to a LBA. Assume that Physical Block 1 is identified as being protected and that word line WLI is identified as the allowed word line; therefore, LBAs are only mapped to the sectors for word line WLI, which are sector 2 and sector 3.

A variation on the above embodiment using LBAs provides for protecting blocks that are only used by the internal controller and are not accessible by the external application. Those blocks are not included in the logical to physical mapping so they are inaccessible by the external application. In this variation, the designer of the internal controller is responsible for only reading and writing to one word line in those blocks. FIG. 11 includes an example of this variation. For example, assume that Physical Block 2 is used by the internal controller and is not accessible by the external application; therefore, there are no mappings from LBAs to sectors in Physical Block 2. Furthermore, sectors 0, 1, 4, 5, 6 and 7 are crossed out indicating that the controller knows not to use those sectors.

Figure 10B:
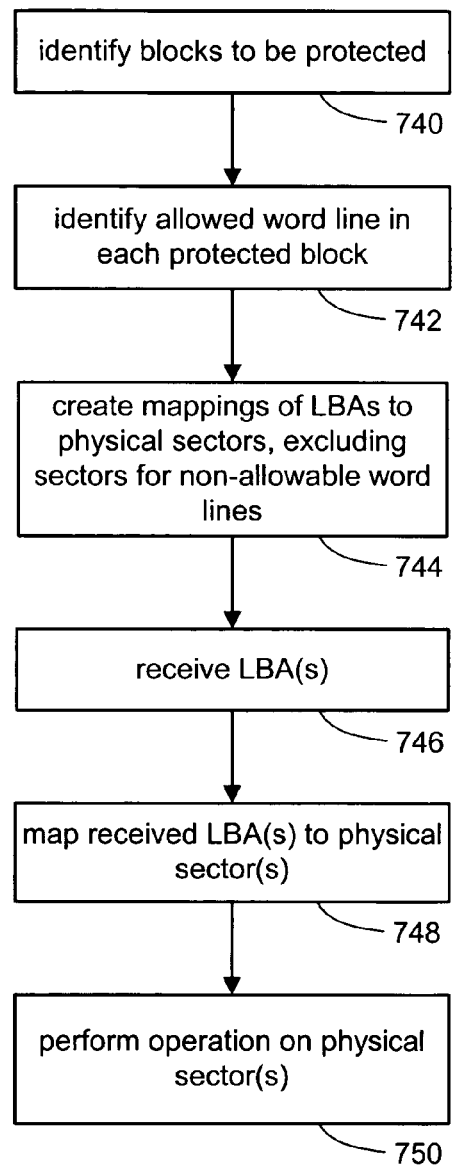
FIG. 10B is a flow chart describing another implementation of a process for operating memory devices without the limitations of Read Disturb.

FIG. 10B is a flow chart describing an implementation of the process of FIG. 10 that pertains to an application operating at the logical block level that reads, programs and/or erases the flash memory. In step 740, the blocks to be protected are identified. In step 742, the one word line allowed to be used in each protected block is identified. In step 744, the mappings of LBAs to physical addresses are created and stored based on the information received in steps 740 and 742. In step 746, one or more LBAs for a data access operation is received. Based on the mappings created in step 744, the received one or more LBAs are mapped to one or more physical sectors (physical addresses) by the controller in step 748. In step 750, the data access operation is performed.

Note that the above examples were described with respect to the system of FIG. 8. Other systems can also be used according to the present invention. For example, the present invention can be used with a removable or non-removable memory card implementing the system of FIG. 5 or another system. In that case, ROM 332 of Controller 318 would include code for programming Controller 318 to operate as described herein. Alternatively, Controller 318 can be hardwired to operate as described herein. RAM 330 may be used to store a list of allowed and prohibited word lines, addresses or logical pages. In one alternative, all or a portion of the contents of RAM 330 and/or ROM 332 can be stored on memory cell array 302. Various physical configurations of the flash memory and the software controller are possible. For example, the flash memory and the controller may be co-located on a removable storage system. Compact Flash storage cards, which contain both flash memory and the controller, use such a design. Another alternative is embedding the flash memory and controller within a larger product. Flash memory and a controller that are embedded within some cell phones are an example of such a design. A third alternative is to have the flash memory and the software controller in separate modules that are brought together for use in the product. Smart Media cards, where the memory is in a removable card and the controller is built into the host product, are an example of this design. Other configurations can also be used.

Some of the above examples explicitly mention the binary mode of operation, where a memory cell stores one bit of data. The present invention also applies to multi-level memory. For example, one word line will be chosen in a protected block. Only memory cells whose control gates are connected to the chosen word line will be programmed and read, with those memory cells being programmed and read using multiple programmed states.

Figure 12:
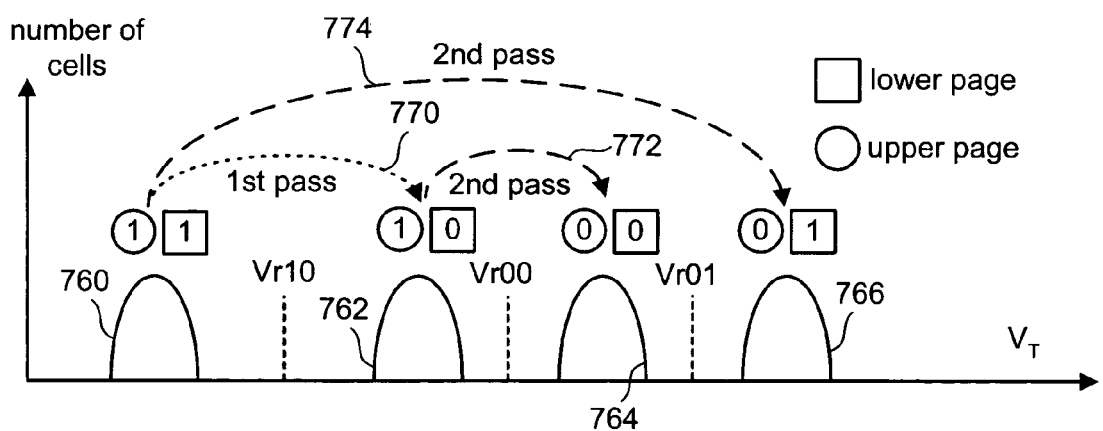
FIG. 12 depicts memory cell threshold distributions and illustrates one example of a technique for programming multi-level memory cells.

There are many means for implementing multi-level memory which can utilize the present invention. FIG. 12 describes one example for implementing multi-level memory. More specifically, FIG. 12 illustrates one example of a two pass technique of programming a 4-state NAND memory cell. The memory cells stores two bits of data. One bit is in a first logical page and a second bit is in a second logical page. The first logical page is referred to as the lower page. The second logical page is referred to as the upper page.

In the example of FIG. 12, the process of programming the lower and upper pages is a two step process. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be within threshold voltage distribution 762, as shown by arrow 770. That concludes the first programming pass.

In a second programming pass, the cell's threshold voltage level is set according to the bit being programmed into the upper logical page. If the upper logical page bit is to store a logic "1," then no programming occurs since the cell is in one of the states corresponding to threshold voltage distributions 760 or 762, depending upon the programming of the lower page bit, both of which carry an upper page bit of "1." If the upper page bit is to be a logic "0," then the threshold voltage is shifted. If the first pass resulted in the cell remaining in the erased state corresponding to threshold distribution 760, then in the second phase the cell is programmed so that the threshold voltage is increased to be within threshold voltage distribution 766, as depicted by arrow 774. If the cell had been programmed into the state corresponding to threshold distribution 762 as a result of the first programming pass, then the memory cell is further programmed in the second pass so that the threshold voltage is increased to be within threshold voltage distribution 764, as depicted by arrow 772. The result of the second pass is to program the cell into the state designated to store a logic "0" for the upper page without changing the data for the lower page.

Note that although specific bit patterns have been assigned to each of the distributions, different bit patterns may be so assigned, in which case the states between which programming occurs can be different than those depicted in FIG. 12.

Figure 1:
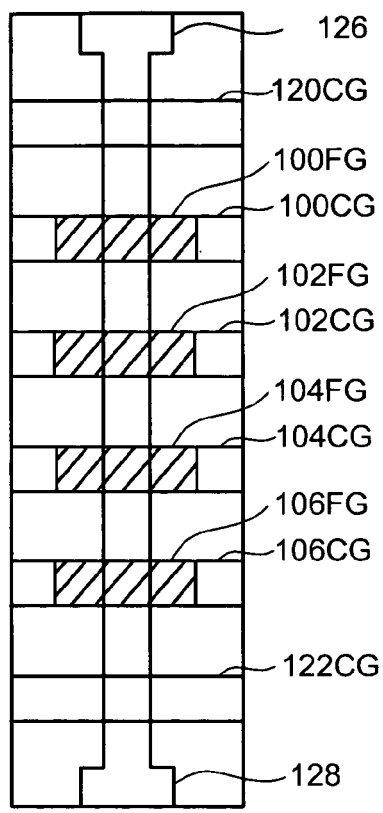
FIG. 1 is a top view of a NAND string.
Figure 2:
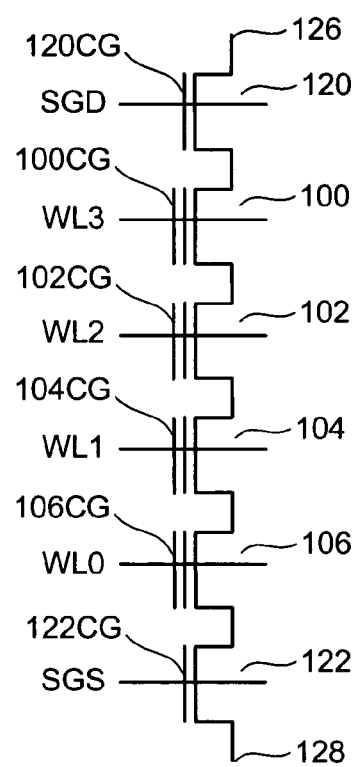
FIG. 2 is an equivalent circuit diagram of the NAND string.
Figure 3:
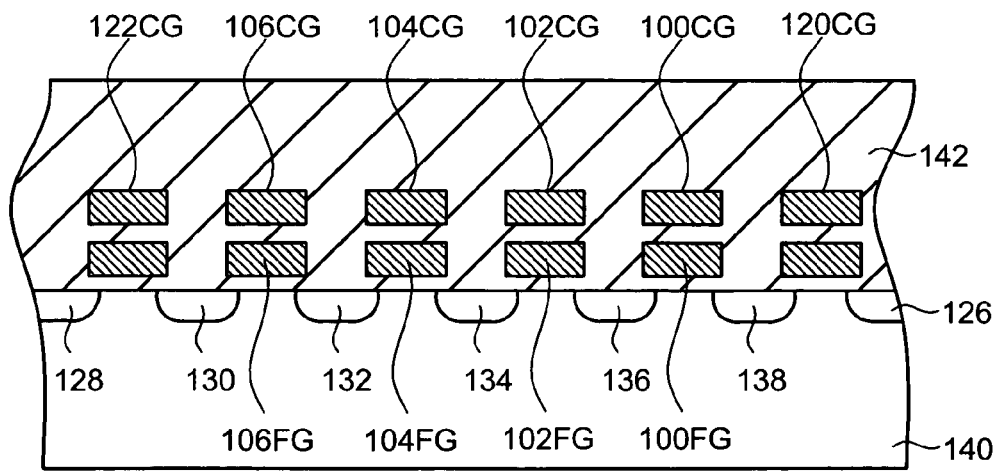
FIG. 3 is a cross sectional view of the NAND string.
Figure 4:
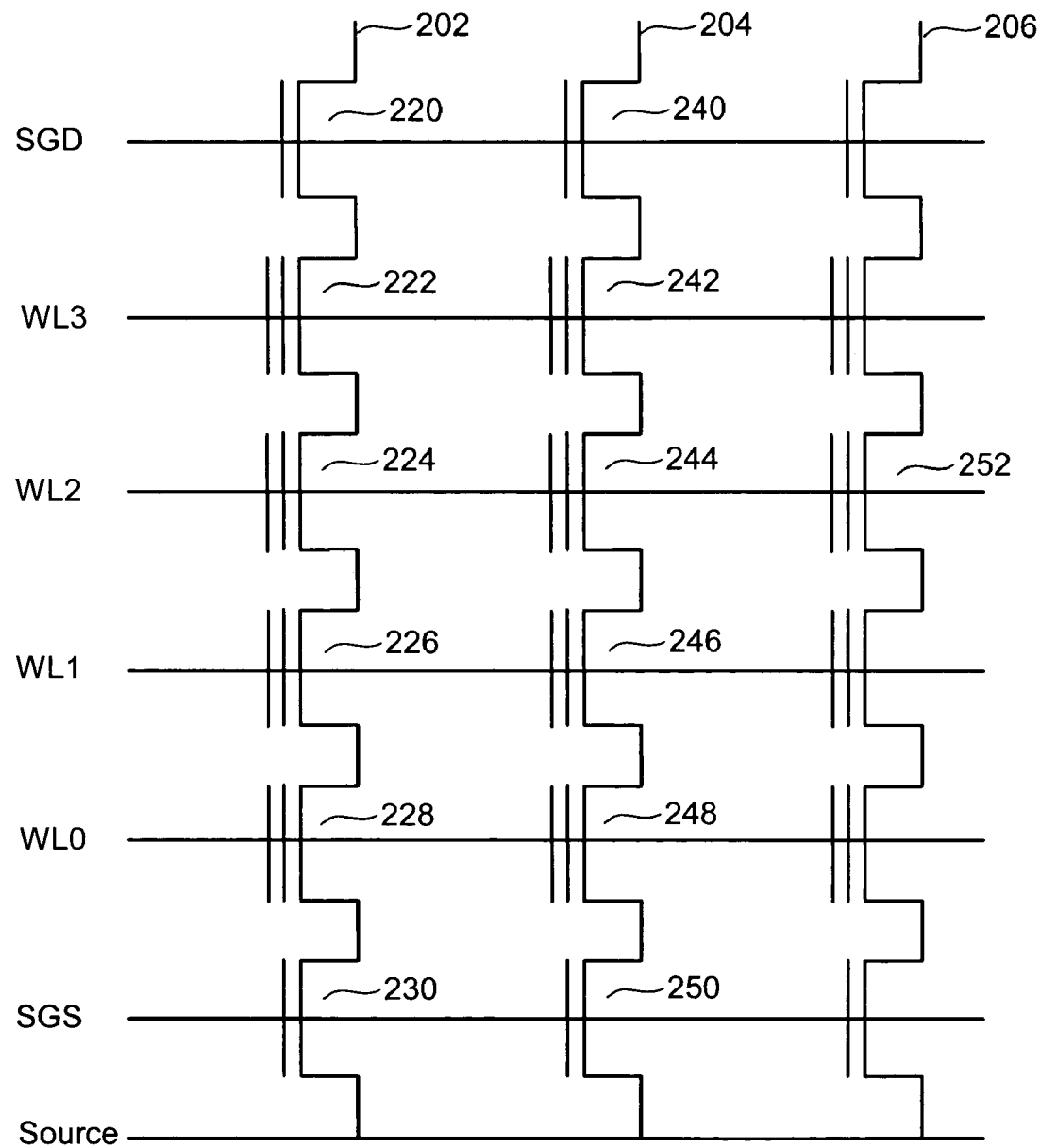
FIG. 4 is a circuit diagram depicting three NAND strings.

In some embodiments, the cells being programmed in parallel are alternate cells along a word line. For example, FIG. 4 illustrates three memory cells 224, 244 and 252 of a much larger number of cells along word line WL2. One set of alternate cells, including cells 224 and 252, store bits from logical pages 0 and 2 ("even pages"), while another set of alternate cells, including cell 244, store bits from logical pages 1 and 3 ("odd pages"). In the above example, logical pages 0 and 1 are lower pages and logical pages 2 and 3 are upper pages.

Note that FIG. 12 also shows read compare points Vr10, Vr00, and Vr01. During a read operation, voltages corresponding to Vr10, Vr00, and Vr01 are applied to the control gate of a memory cell to determine at what point the memory cell conducts and doesn't conduct. Based on the three read operations, the memory system can determine which threshold distribution (e.g. which state) the memory cell is in. For example, if the memory cell does not conduct for any of the three read operations, the memory cells in state 01. If the memory cell only conducts when applying Vr01 to the control gate, the memory cells in state 00. If the memory cell conducts when applying Vr00 and not when applying Vr10, then the memory cell is in state 10. If the memory cell conducts when applying Vr10, Vr00, and Vr01, then the memory cells in state 11. In one embodiment, each of the read compare points Vr10, Vr00, and Vr01 are midpoints between adjacent threshold distributions. One set of examples of read compare points include Vr10=0 volts, Vr00=1.2 volts and Vr01=2.2 volts. However, other values can also be used.

When performing the process of FIG. 10, the unselected word lines would receive 5 volts during a read operation, while the selected word line is stepped 0 volts to 1.2 volts to 2.2 volts. While the selected word line will receive 2.2 volts which could cause some electrons to move to the floating gate, 2.2 volts is relatively small, especially compared to 5 volts. Therefore, the effects of Read Disturb are not likely to be realized during the lifetime of any electronics device.

The above examples are provided with respect to a flash memory system. However, the principles of the present invention have application to other types of flash memory systems as well as other types of memories (e.g. other integrated circuit/solid state/semiconductor memories, and others), including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for using memory, comprising the steps of:
   performing read operations for a set of non-volatile storage elements associated with a first word line, said set of non-volatile storage elements are part of a group of non-volatile storage elements; and
   prohibiting read operations for non-volatile storage elements in said group that are associated with other word lines.

2. A method according to claim 1, wherein:
   said step of performing read operations includes applying a read compare voltage to said first word line and another voltage to said other word lines.

3. A method according to claim 1, wherein:
   said group of non-volatile storage elements is a block of non-volatile storage elements.

4. A method according to claim 1, wherein:
   said group of non-volatile storage elements are flash memory cells.

5. A method according to claim 1, wherein:
   said group of non-volatile storage elements are NAND flash memory cells.

6. A method according to claim 1, wherein:
   said group of non-volatile storage elements are NAND flash memory cells arranged on a set of NAND strings;
   said first word line connects to each of said NAND strings;
   said other word lines connect to each of said NAND strings; and
   said step of performing read operations includes applying a read compare voltage to said first word line and a pass voltage to said other word lines.

7. A method according to claim 1, wherein:
   said group of non-volatile storage elements are multi-level NAND flash memory cells.

8. A method according to claim 1, wherein:
   said group of non-volatile storage elements is a block of multi-level NAND flash memory cells;
   said first word line is associated with a first logical page and a second logical page; and
   said other word lines are associated with other logical pages.

9. A method according to claim 1, further comprising the steps of:
   performing program operations for said non-volatile storage elements associated with said first word line; and
   prohibiting program operations for said non-volatile storage elements in said group that are associated with said other word lines.

10. A method according to claim 9, wherein:
    said group of non-volatile storage elements is a block of NAND flash memory cells arranged on a set of NAND strings;
    said first word line connects to each of said NAND strings;
    said other word lines connect to each of said NAND strings; and said step of performing read operations includes applying a read compare voltage to said first word line and a pass voltage to said other word lines.

11. A method according to claim 9, wherein:
said non-volatile storage elements are multi-level NAND flash memory cells;
said first word line is associated with a first logical page and a second logical page; and
said other word lines are associated with other logical pages.

12. A method according to claim 1, wherein said steps of performing read operations and prohibiting read operations includes:
receiving a physical address for a particular read operation;
determining whether said physical address is valid;
performing said particular read operations if said physical address is valid; and
not performing said particular read operations if said physical address is not valid.

13. A method according to claim 1, wherein said steps of performing read operations and prohibiting read operations includes:
receiving a logical address for a particular read operation; and
mapping said logical address to a valid physical memory location associated with said first word line.

14. A method for using memory having a set of word lines, comprising the steps of:
performing read operations to one or more logical pages associated with a first control line of a block of non-volatile storage elements; and
prohibiting read operations to logical pages associated with other control lines of said block of non-volatile storage elements.

15. A method according to claim 14, wherein:
said non-volatile storage elements are NAND flash memory cells arranged on a set of NAND strings;
said first control line is a first word line that connects to each of said NAND strings;
said other control lines are other word lines that connect to each of said NAND strings; and
said step of performing read operations includes applying a read compare voltage to said first word line and a pass voltage to said other word lines.

16. A method according to claim 14, wherein:
said non-volatile storage elements are multi-level NAND flash memory cells.

17. A method for using memory, comprising the steps of:
performing read operations for a group of non-volatile storage elements associated with a particular word line; and
prohibiting read operations for non-volatile storage elements associated with one or more word lines that neighbor said particular word line.

18. A method according to claim 17, further comprising the steps of:
performing program operations for said group of non-volatile storage elements associated with said particular word line; and
prohibiting program operations for said non-volatile storage elements associated with word lines that neighbor said particular word line.

19. A method according to claim 17, wherein:
said group of non-volatile storage elements are NAND flash memory cells arranged on a set of NAND strings;

said particular word line connects to each of said NAND strings; and
said word lines that neighbor said particular word line connect to each of said NAND strings.

20. A method according to claim 17, wherein:
said group of non-volatile storage elements are multi-level NAND flash memory cells.

21. A method according to claim 17, wherein:
said group of non-volatile storage elements associated with said particular word line and said non-volatile storage elements associated with word lines that neighbor said particular word line are grouped together as a subset of a larger set of non-volatile storage elements.

22. A method for using memory, comprising the steps of:
performing read operations to a first word line of a group of non-volatile storage elements; and
prohibiting read operations to all other word lines of said group of non-volatile storage elements.

23. A method according to claim 22, wherein:
said group of non-volatile storage elements is a block of NAND flash memory cells.

24. One or more processor readable storage devices having processor readable code embodied on said processor readable storage devices, said processor readable code for programming one or more processors to access non-volatile memory, said processor readable code:
allows read operations to one word line of a block of non-volatile storage elements; and
prohibits read operations to all other word lines of said block of non-volatile storage elements.

25. One or more processor readable storage devices according to claim 24, wherein said processor readable code:
allows program operations to said one word line; and
prohibits program operations to all other word lines of said block of non-volatile storage elements.

26. One or more processor readable storage devices according to claim 24, wherein:
said non-volatile storage elements are NAND flash memory cells arranged on a set of NAND strings;
said first word line connects to each of said NAND strings;
said other word lines connect to each of said NAND strings; and
said processor readable code programs said one or more processors to perform read operations that include applying a read compare voltage to said first word line and a pass voltage to said other word lines.

27. One or more processor readable storage devices according to claim 26, wherein:
said non-volatile storage elements are multi-level NAND flash memory cells;
said first word line is associated with a first logical page and a second logical page; and
said other word lines are associated with other logical pages.

28. A memory system, comprising:
an array of non-volatile storage elements grouped into sets of non-volatile storage elements, each set of non-volatile storage elements being at least partially controlled by a set of word lines; and
a control system, said control system performs read operations for a first word line of a first set of said non-volatile storage elements and will not perform read operations for other word lines of said first set of said non-volatile storage elements.

29. A memory system according to claim 28, wherein:
said sets of non-volatile storage elements are blocks of non-volatile storage elements.

30. A memory system according to claim 28, wherein said control system:
determines whether a physical address is valid;
performs said read operations for said first word line if said physical address is valid; and
does not perform read operations for other word lines if said physical address is not valid.

31. A memory system according to claim 28, wherein:
said control system accesses a logical address for a particular read operation and maps said logical address to a valid physical address associated with said first word line.

32. A memory system according to claim 28, wherein:
said first set of non-volatile storage elements are NAND flash memory cells arranged on a set of NAND strings;
said first word line connects to each of said NAND strings;
said other word lines connect to each of said NAND strings; and
said controller performs read operations for said first word line by applying a read compare voltage to said first word line and a pass voltage to said other word lines.

33. A memory system according to claim 28, wherein:
said non-volatile storage elements are multi-level NAND flash memory cells;
said first word line is associated with a first logical page and a second logical page; and
said other word lines are associated with other logical pages.

34. A memory system according to claim 28, wherein:
said control system performs program operations for said first word line of said first set of non-volatile storage elements and will not perform program operations for said other word lines of said first set of non-volatile storage elements.

35. A method for using memory, said memory including blocks of non-volatile storage elements, comprising the steps of:
identifying a block to be protected;
identifying a word line to be used in said block to be protected;
performing read operations to said word line to be used in said block to be protected; and
prohibiting read operations to all other word lines of said block to be protected.

36. A method according to claim 35, wherein said steps of performing and prohibiting includes:
determining if a physical address associated with a particular read operation is on said word line to be used in said block to be protected;
performing said particular read operation if said physical address is on said word line to be used in said block to be protected; and
not performing said particular read operation if said physical address is on a different word line in said block to be protected.

37. A method according to claim 35, wherein said steps of performing and prohibiting includes:
mapping a logical address to an appropriate physical location associated with said word line to be used in said block to be protected.

38. A method according to claim 35, further comprising the steps of:
performing program operations to said word line to be used in said block to be protected; and
prohibiting program operations to all other word lines of said block to be protected.

39. A method according to claim 35, wherein:
said non-volatile storage elements are NAND flash memory cells arranged on a set of NAND strings;
said word line to be used connects to each of said NAND strings; and
said other word lines connect to each of said NAND strings.

40. A method according to claim 35, wherein:
said non-volatile storage elements are multi-level NAND flash memory cells;
said word line to be used in said block to be protected is associated with a first logical page and a second logical page; and
said other word lines are associated with other logical pages.

41. A method according to claim 35, wherein:
said non-volatile storage elements are NAND flash memory cells.

* * * * *